United States Patent [19]
Clarke et al.

[11] Patent Number: 5,621,216
[45] Date of Patent: Apr. 15, 1997

[54] HARDWARE/SOFTWARE IMPLEMENTATION FOR MULTIPASS E-BEAM MASK WRITING

[75] Inventors: Eileen V. Clarke; William A. Enichen; John G. Hartley, all of Dutchess County, N.Y.

[73] Assignee: International Business Machines Corporation, Armonk, N.Y.

[21] Appl. No.: 638,410

[22] Filed: Apr. 26, 1996

[51] Int. Cl.⁶ .................................................. H01J 37/304
[52] U.S. Cl. ............................................................ 250/492.22
[58] Field of Search ........................... 250/492.22, 492.2, 250/398; 364/490, 491

[56] References Cited

U.S. PATENT DOCUMENTS 4,477,729 10/1984 Chang et al. ...................... 250/492.22
4,816,692 3/1989 Rudert, Jr. ......................... 250/492.22

*Primary Examiner*—Jack I. Berman
*Assistant Examiner*—Kiet T. Nguyen
*Attorney, Agent, or Firm*—Whitham, Curtis, Whitham & McGinn; Charles W. Peterson, Jr.

[57] ABSTRACT

A process smooths the edges of rectangles written by an E-beam lithography system to improve critical dimension (CD) control in these shapes in the preparation of X-ray masks. The CD tolerances of X-ray masks are improved without the usual postprocessing costs normally associated with multipass solutions, thereby saving time and money when multipass writing is used in X-ray lithography. Two enhancements are provided to an X-ray mask maker that allow use of the same E-beam drive code for each exposure of a multipass write operation.

7 Claims, 6 Drawing Sheets

HARDWARE/SOFTWARE IMPLEMENTATION FOR MULTIPASS E-BEAM MASK WRITING

BACKGROUND OF THE INVENTION

1. Field of the Invention

The present invention generally relates to the manufacture of very large scale integrated (VLSI) circuit devices and, more particularly, to the preparation of X-ray masks used in lithographic processes to transfer patterns onto a devices substrate in the manufacture of semiconductor memory and logic chips.

2. Background Description

Manufacturing of semiconductor devices is dependent upon the accurate replication of computer aided design (CAD) generated patterns onto the surface of a device substrate. The replication process is typically performed using a lithographic process followed by a variety of subtractive (etch), additive (deposition) and material modification (e.g., oxidations, ion implants, etc.) processes.

X-ray mask images are made the same size as the final images on the wafer, whereas most optical masks have images four or five times the size of the images on the wafer. The optical stepper uses a precision reduction lens to reduce the mask image to the image that is exposed on the wafer. Because of the one-to-one relationship of the image on an X-ray mask and the image formed on the wafer, any position errors in building the X-ray mask are replicated one for one onto the wafer. Thus, the position accuracy requirements for the fabrication of X-ray masks are very difficult to achieve.

X-ray masks are fabricated using an electron beam (E-beam) lithography system. There are several different E-beam lithography system architectures. One architecture that is used by several manufacturers, including IBM Microelectronics, is a shaped beam with a deflection field made up of subfields. Position errors in this type of architecture occur at spot boundaries, subfield boundaries, and field boundaries. One method to reduce the random errors at these boundaries is multipass writing. Each pattern of the multipass write is shifted relative to the field and subfield boundaries. The exposure of each pass dose is reduced such that the sum of the multiple exposure doses is equivalent to a fully exposed single dose. The E-beam resist is partially exposed on each exposure pass which has the effect of fully exposing the resist at the average position. This averaging action reduces the effect of the random position noise. The shifting of the pattern relative to the various boundaries reduces jogs at those boundaries.

Before a pattern can be written on the E-beam system, the design must be converted into E-beam drive code. One implementation of multipass writing uses a parameter in the program that converts the design data to E-beam drive code to shift the pattern with respect to the field and subfield boundaries. The mask stage addresses are adjusted so that each writing pass will overlay on the mask being written. A second implementation changes the size of the fields and the size of the subfields on the E-beam exposure tool. The program that converts the design data into E-beam drive code is run with parameters to match the tool setups. Both of these methods require running the design data through software programs that convert the design data to electron beam drive code multiple times, once for each writing pass. The computer time cost of running the conversion program is high. A typical large memory art may cost $5,000 to process. Another cost is the cost of the hardware to store the E-beam drive code. To store the drive code for each pass may require as much as a quarter of a gigabyte of disk space. To write four passes (typical in current multipass implementations) would require four different copies of the E-beam drive code.

SUMMARY OF THE INVENTION

It is therefore an object of the present invention to provide a process which smooths the edges of rectangles written by an E-beam lithography system, thereby improving critical dimension (CD) control in these shapes in the preparation of X-ray masks.

It is another object of the invention to improve the CD tolerances of X-ray masks without the usual postprocessing costs normally associated with multipass solutions, thereby saving time and money when multipass writing is used in X-ray lithography.

According to a preferred embodiment of the invention, there are provided two enhancements to a known X-ray mask maker, known as the EL-4 E-beam mask maker. These enhancements allow use of the same E-beam drive code for each exposure of a multipass write operation, thereby saving substantially on the amount of disk space required to store the drive code. The invention moves the location of where the boundary between the subfields occurs and where the spot boundaries occur within the rectangles.

This invention builds on the base of the EL-4 E-beam mask maker. The current hardware on the EL-4 E-beam mask maker takes a rectangle defined in one subfield and extending into an adjacent subfield and divides it into two rectangles in each of the subfields. At the boundary between subfields, the rectangles are overlapped by one spot common to each rectangle. The spots that are overlapped are exposed at a specified fraction of the full exposure dose. By changing the definition of where the subfield boundary is located, the break between the subfields is moved. Currently, the values of the subfield boundaries (in Cartesian coordinates X and Y) are defined once at hardware initialization. This invention uses a table of values for the subfield boundaries with new values selected for each pass. The boundary can be shifted in both X and Y axes and in positive and negative directions. This moves the location of the overlapped spot within the rectangle which in turn smooths out the edges of the rectangle crossing a subfield boundary resulting in improved subfield stitch.

While the invention is described in terms of a preferred embodiment which enhances a known X-ray mask maker, the EL-4E beam mask maker device, those skilled in the art will recognize that the teachings of the invention can be applied to other X-ray mask makers to realize the same improvements.

BRIEF DESCRIPTION OF THE DRAWINGS

The foregoing and other objects, aspects and advantages will be better understood from the following detailed description of a preferred embodiment of the inventions with reference to the drawings, in which.

DETAILED DESCRIPTION OF A PREFERRED EMBODIMENT OF THE INVENTION

Figure 1:
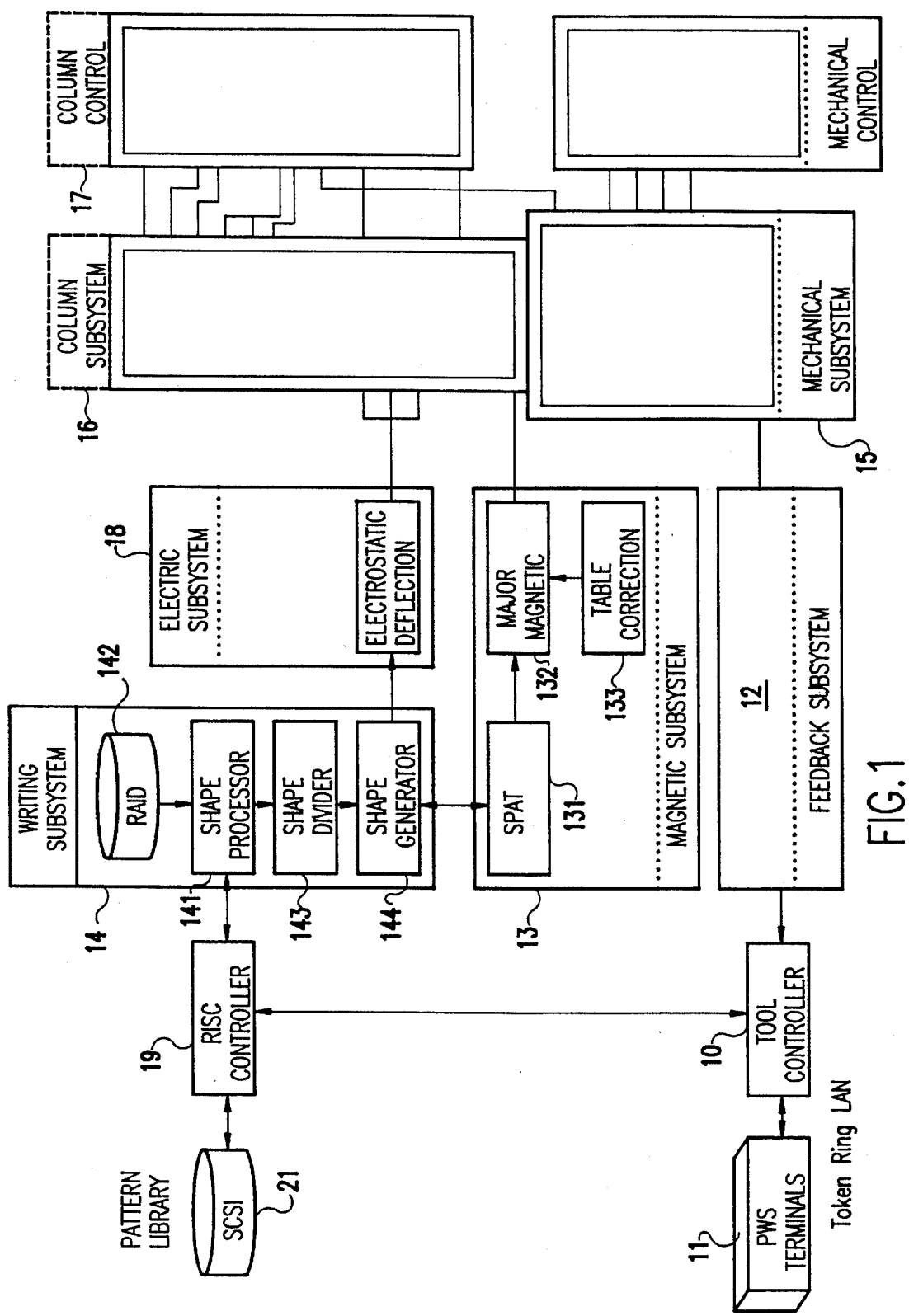
FIG. 1 is a block diagram of a control system and pattern writing portion of E-beam exposure apparatus.

Referring now to the drawings, and more particularly to FIG. 1, there is shown a simplified block diagram of the EL-4 lithography system. The tool controller 10 is an IBM personal computer (PC) that synchronizes the writing of the mask and the running of calibration and diagnostic programs. The operator interface is another IBM PC, called a programmable workstation (PWS) 11. There may be more than one PWS 11 connected to the tool controller 10 in a token ring local area network (LAN). The operator prepares jobs on the PWS 11. A job consists of a description of which patterns are written at which location on the mask. The operator controls the tool from this workstation.

Initially, the operator runs a calibration program before starting to write a mask, and then starts the job for that particular mask. The feedback subsystem 12 collects data during the calibration operation. The beam is scanned over a calibration grid. The signal from the backscattered electrons is collected and analyzed to determine the deflection errors. A set of corrections is calculated and then used to modify the deflection.

The deflection is loaded into the Subfield Position and Timing (SPAT) unit 131 of the magnetic subsystem 13. The SPAT unit 131 processes the corrections and position coordinates for the center of each subfield. This data is sent to the magnetic deflection system 132 via fiber optics. When the system is writing a pattern on the mask, the SPAT unit 131 signals the shape generator 144 of the writing subsystem 14 that the magnetic deflection has moved the beam and the beam has settled at the position of the next subfield. The shape generator 144 then processes all the pattern data for that subfield and then signals the SPAT unit 131 to step the beam to the next subfield. The table correction unit 133 applies a correction to the magnetic deflection to correct for any difference between the actual position of the table as measured by a laser interferometer and the command address from the tool controller.

The mechanical system 15 controls the motion of the table on which the mask is clamped while writing. It also controls the vacuum system and mask load/unload sequencing. The column control 17 controls the alignment coils and the lens in the column subsystem 16. The column subsystem contains 16 the electron optic components. At the top of the column is the gun, which is the source of the electrons. The electrons illuminate a square aperture that is then imaged on a second square aperture. By deflecting the image of the first square aperture over the second square aperture, a shaped spot is produced. The intersection of the image of the first aperture with the second aperture is then imaged down to the mask. The column subsystem 16 contains a set of blanking plates to control the exposure time per spot and electric deflectors to deflect the spot within the subfield.

The shape generator 144 breaks up the rectangles from the shape divider 143 into individual spots and sends the shaping, position within the subfield and blanking information to the electric subsystem 18. The electric subsystem converts the digital control signals to analog signals that control the hardware in the column subsystem 16. When the tool controller 10 starts to write a mask, it receives a list of patterns that will be written on the mask from a job control file. The tool controller 10 sends this list of patterns to the RISC (Reduced Instruction Set Computer) controller 19 that then copies the required patterns from the pattern library 21, which is made up of SCSI (Small Computer System Interface) disk drives, to the RAID (Redundant Array of Inexpensive Drives) drive system 142 in the writing subsystem 14. This done by communicating with the shape processor 141, which is a PowerPC™ microprocessor board. The shape processor 141 also contains some custom logic that handles pattern commands that are expanded into rectangle definitions. This allows some data compaction to reduce the pattern data volume. The custom logic also processes macros, repetitive patterns used multiple times. The data from the shape processor 141 is sent to the shape divider 143 that divides rectangles that cross subfield boundaries into rectangles that are contained within a single subfield. The shape divider 143 also indicates which edge is crossing the boundary so that the spots on those edges will be written with reduced exposure. The rectangles are defined in such a way that there will be one spot overlap at the boundary.

Figure 2:
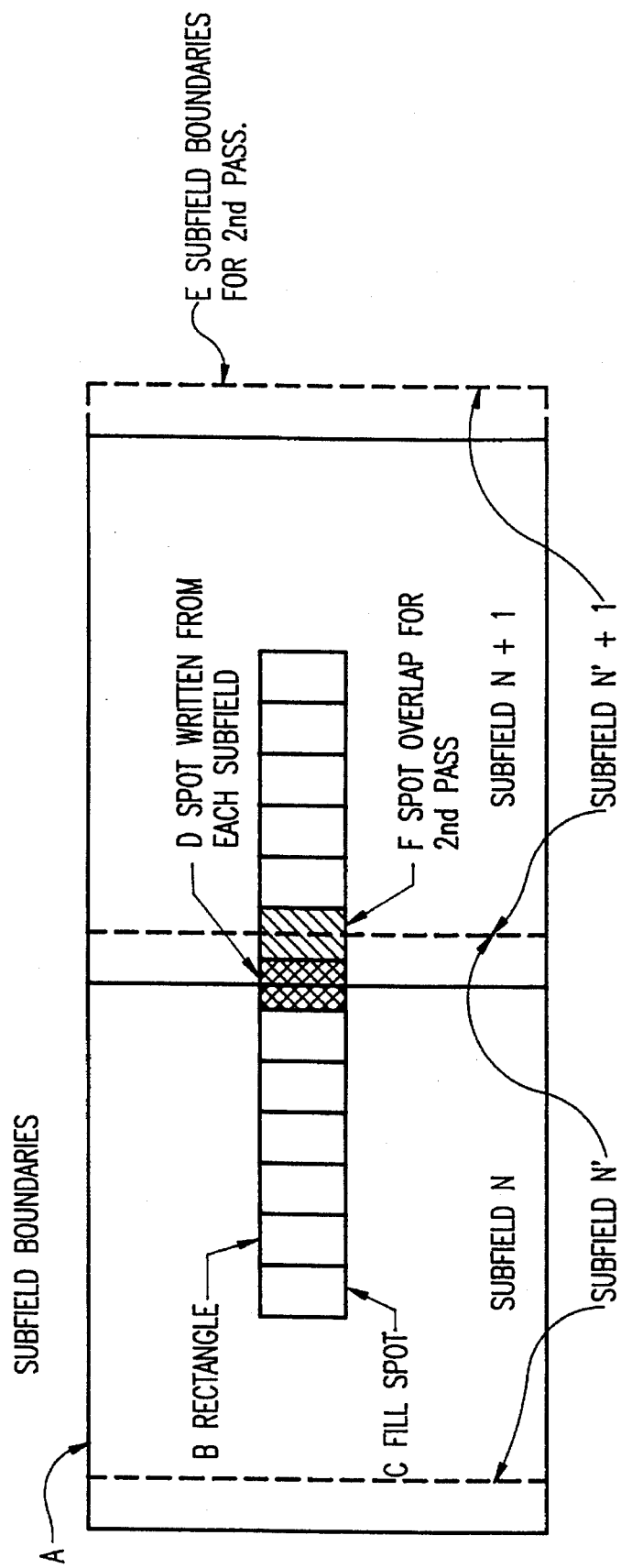
FIG. 2 is a plan view illustrating a rectangle extending into an adjacent field illustrating the first enhancement according to the invention.

The first enhancement to the E-beam tool shown in FIG. 1 is to the shape divider 143. The shape divider 143 shown in FIG. 1 on the EL-4E beam mask determines how the boundary location between subfields is moved between the exposures resulting better subfield stitch. FIG. 2 illustrates the basic principles of this enhancement according to the invention. More particularly, FIG. 2 shows a rectangle that originates in subfield N and extends into subfield N+. Also shown are subfields N' and N'+1, which results when the subfield boundary is shifted to the right. Note the overlapped spot also shifts to the right, but the ends of the rectangle do not change location. The solid lines indicated by A show the subfield boundaries defined on the first exposure pass. B is a rectangle defined into two rectangles, one written from subfield N and one written from subfield N+1. The rectangle B is divided into spots that are exposed with a single flash of the E-beam. C shows one of the spots used to fill the area defined by the rectangle. D shows the spot location of the spot that crosses the subfield boundary. This spot is written as a partial exposure from each subfield. E shows with dashed lines how the subfield boundaries will be shifted to the right on the second pass of a multipass exposure. The overlap spot has moved one spot to the right to position F. At position F on the second pass, this location will be written from each subfield at reduced dose. On the next pass, the subfield boundaries will shift to the left of the original boundaries. Passes can also shift in the Y axis or combinations of X and Y shifts to smooth out the vertical rectangles crossing horizontal subfield boundaries.

The second enhancement according to the invention involves changes to the shape generator. The shape generator 144 shown in FIG. 1 on the EL-4 E-beam mask maker determines how to fill a defined rectangle with shaped spots. The algorithm implemented in the shape generator 144 treats the X and Y axes independently; therefore, only the X axis will be discussed. The algorithm finds, by using a look-up table, two spot sizes that differ by one least significant bit (LSB) that can be used to fill the defined rectangle. The current implementation always exposes the larger spots first. This invention controls which size spot is used first in each axis for the rectangle fill for each pass of the multipass write.

Figure 3:
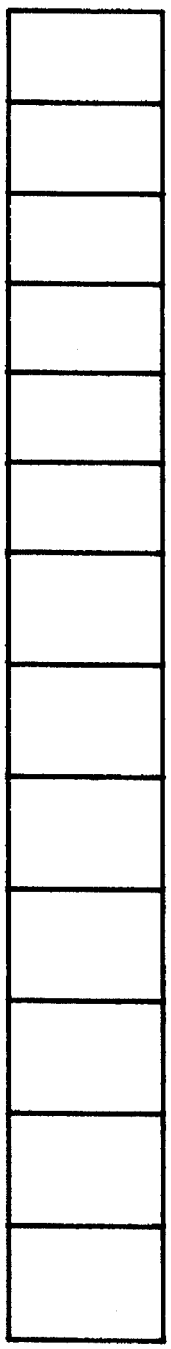
FIG. 3 is a plan view of a spot fill of a rectangle and illustrating the second enhancement according to the invention.
Figure 3:
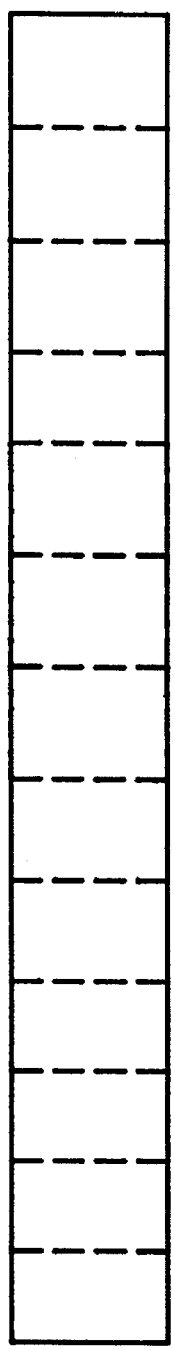
Figure 3:
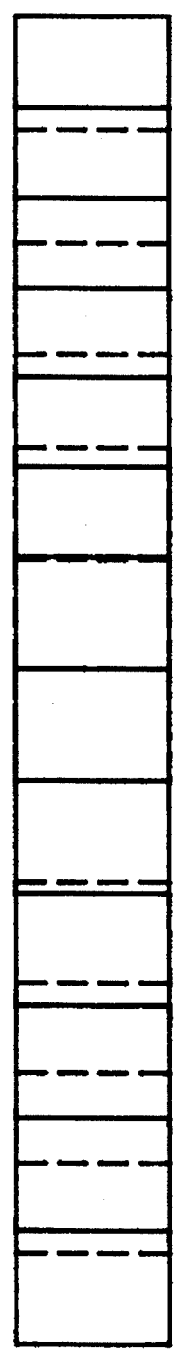

In FIG. 3, the top rectangle shows the current fill implemented by the hardware. The second rectangle shows writing the smaller spots first. This invention switches the spot size which is written first on each pass. The last rectangle shows the effect of superimposing the two previous rectangles. This can also be done in the Y axis as well. The effect of this is to move the spot boundaries within a rectangle, smoothing the edges. Both of these enhancements to the EL-4E beam mask maker hardware improve the accuracy of an X-ray mask maker without the added cost of processing the design data into drive code multiple times.

Figure 4A:
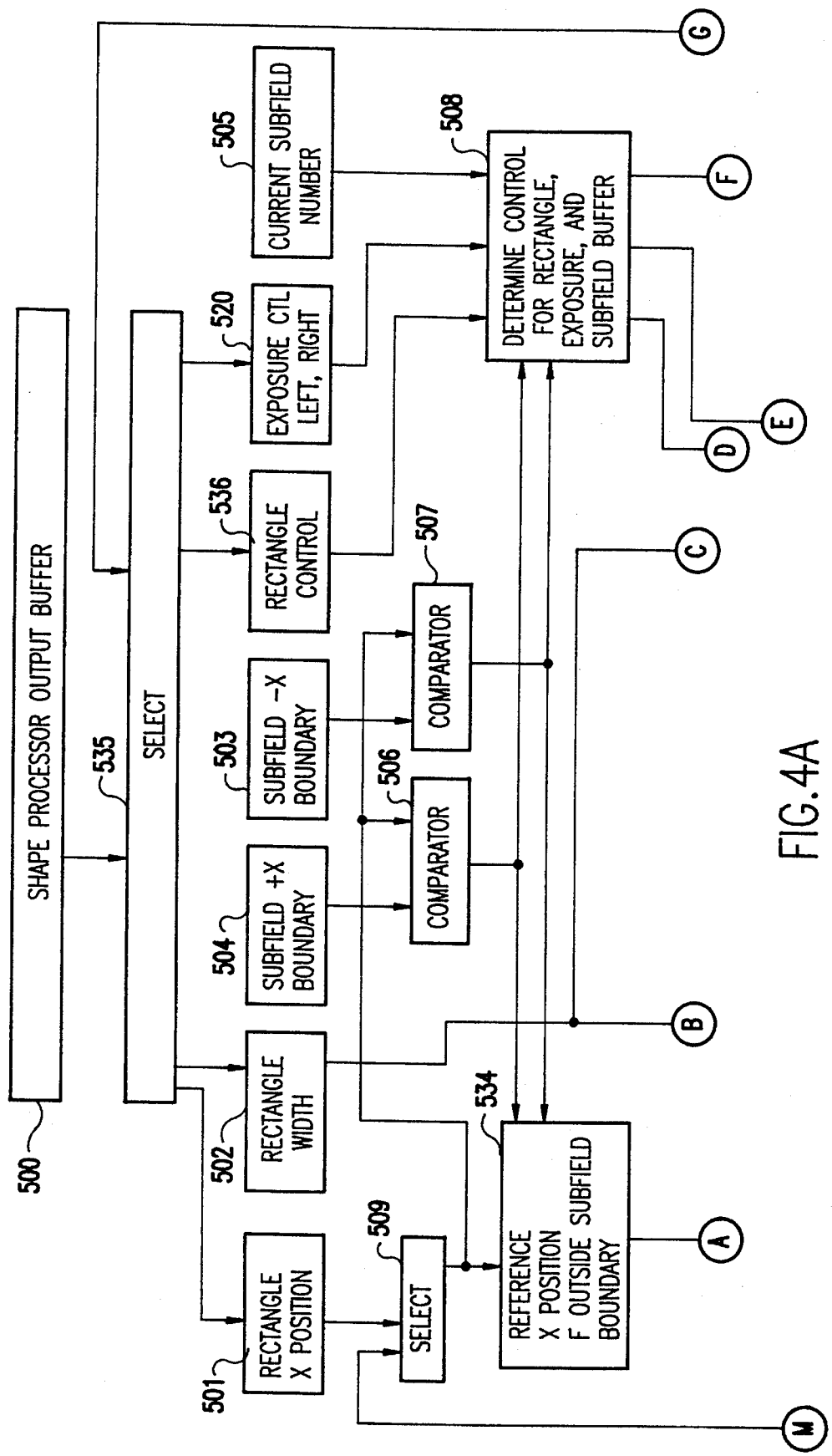
FIG. 4 is a block diagram showing the shape generator of the E-beam exposure apparatus shown in FIG. 1 which implements the second enhancement according to the invention.
Figure 4B:
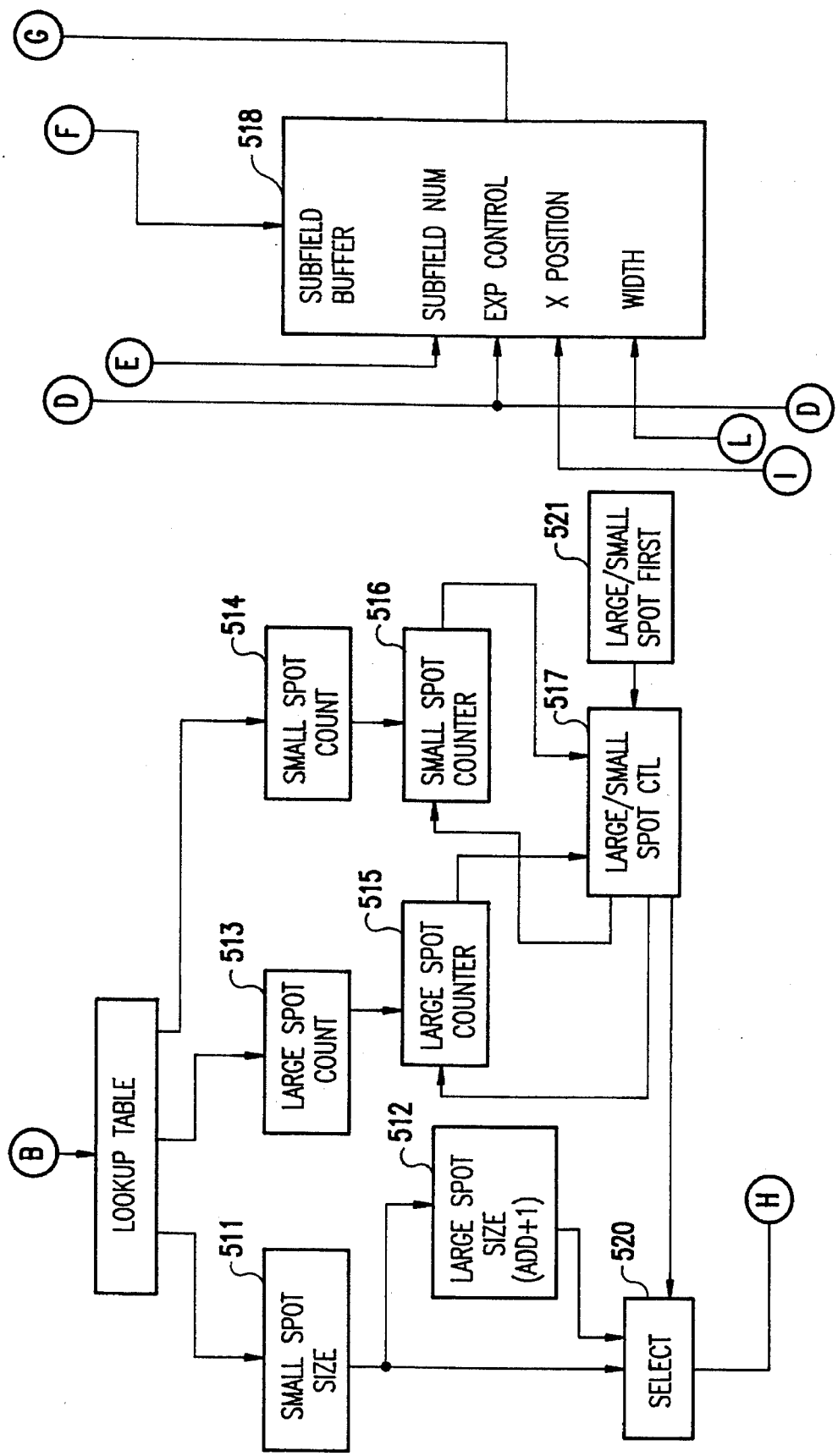
Figure 4C:
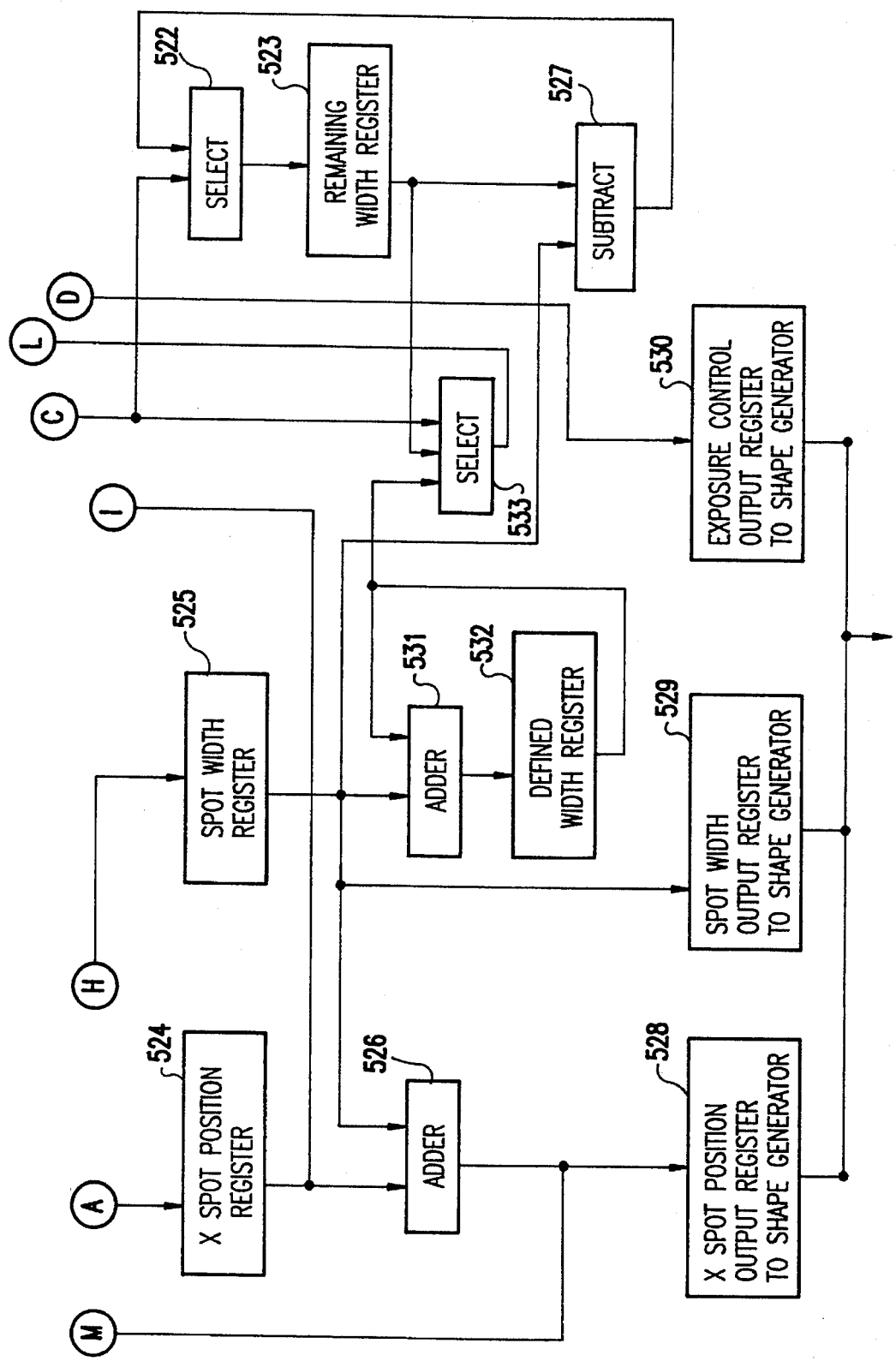

FIG. 4 shows the hardware implementation of a preferred embodiment of the invention. To simplify the drawing and the description, only the X-axis is shown. The same functions occur for the Y-axis. Because of the close interaction between the operations of the shape divider 143 and the shape generator 144 (FIG. 1), they are combined in this implementation.

At the beginning of each new subfield, the subfield buffer 500 is scanned to see if any rectangles have been stored for the current subfield from previous subfields. These stored rectangles would be the result of a rectangle defined in one subfield that extends into an adjacent subfield but cannot be written until the beam is deflected to that particular subfield. The output from the subfield buffer is selected by selector 535. After the rectangles from the subfield buffer are processed, the selector 535 is switched to route the output from the shape processor 141 in FIG. 1 to the input of this unit. The rectangle X position, the rectangle X width, rectangle control, and rectangle exposure control are loaded into registers from the shape processor. These registers are 501, 502, 536, and 520. At the beginning of each exposure pass, the +X subfield boundary 504 and the −X subfield boundary register 503 are loaded by the tool controller. This implementation allows the subfield boundary definition to be changed for each exposure pass. This is not possible in the current implementation of the system. The subfield boundary limits could also be changed for different patterns. This ability to change the subfield definition dynamically is a feature of this invention.

The new rectangle data from the shape processor is now processed. The rectangle X position is selected by selector 509. The X position is checked to see if it falls within the subfield boundaries using comparators 506 or 507. The output of the selector 509 is compared with the appropriate boundary limit using comparator 506 or 507. Which comparator to use depends on whether the system is scanning the subfields from right to left or left to right. If the X position falls outside the boundary of the current subfield, it is re-referenced for the coordinate system of the subfield it does fall in. This would be the case when the system is moving from right to left and the rectangle spans two subfields it would have its origin in the subfield to the left of the current subfield. The subfield number is changed by function 508. The new re-referenced value is stored in the subfield buffer 518 and is passed to the X spot position register 524 for determining rectangle width.

The spot allocation processing will first be described for a rectangle within the current subfield, and then the case of the re-referenced subfield will be described. The large/small spot first control parameters 521 are also set from the tool controller 10 (FIG. 1) at the start of the exposure pass. The rectangle width 502 is used as a table entry into the look up table 510 that has also been loaded by the tool controller 10 at the beginning of the exposure pass. The output from the look up table loads the small spot size register 511, loads the small spot size counter 514 and loads the large spot counter 516. The large spot is one LSB larger than the small spot and is calculated by adder 512. For the first spot of a rectangle, the initial position is selected by selector 520 which is controlled by the spot control logic 517.

The first spot position is calculated by adder 526 which adds the spot width from register 525 to the X spot position from register 524. This result goes to selector 509 and to the X spot position output register 528. If the spot does not cross the subfield boundary, this position will be the position to use for the next spot. The spot counter 515 or 516 for the first spot size used is decremented. The spot control logic 517 will use the same size spot until the corresponding counter goes to zero.

Each time a spot is processed, the subtractor subtracts the spot used from the running width register 523. This continues until both spot counters are zero or a boundary comparator indicates that the spot has crossed into the next subfield. If the comparison with the subfield boundary indicates that the spot position has crossed into the adjacent subfield, the spot's exposure control data is modified by function 508 to reflect that this spot must be exposed with reduced exposure since it will be exposed by two subfields. The spot information, position, width, and exposure are then registered into the output buffers 528, 529 and 530, and this data is supplied by the shape generator 144 in FIG. 1. The re-referenced X position register 534, the remaining width register 523 and the exposure data 508 are stored in the subfield buffer 518. The calculate subfield number logic 505 determines the subfield number and address that will be used to store the new rectangle definition information. In the case of X rectangles, it will be the next subfield. Some additional exposure control information is also stored to indicate which edge of the rectangle has the overlap so that the spots on the edge will be exposed with reduced exposure since they will be exposed from two subfields.

For the case where the rectangle has been re-referenced, the spot size, spot X position and exposure are not loaded into the output registers 529 and 530. The original position is processed as above, incrementing the position by the selected spot width register 525 as above. The adder 531 and the defined width register 532 keep track of the width of the rectangle as the spots are processed. The X position is compared in comparator 506 to indicate when the spot has crossed into the current subfield. When this occurs, the contents of the defined width register 532 is stored in the subfield buffer 518 as the width for the re-referenced rectangle. The remaining part of re-referenced rectangle is now in the current subfield. The spot position, spot width and exposure output registers 528, 529 and 530 are enabled, and the rectangle is processed as above.

From the foregoing, it will be appreciated that the invention involves two techniques which, together, can improve the pattern placement and pattern fidelity when writing in a multipass exposure mode. This invention uses the same pattern drive code for each pass of the multipass exposure rather than generate and store multiple copies of the drive code as is done with the staggered field method multipass technique. By adding additional hardware/software to the current EL-4E beam mask maker divider hardware, the boundary location between subfields is moved between the exposures resulting in better subfield stitch. Also, the addition of additional hardware/software to the current EL-4E beam mask maker shape generator allows the boundary location of the spots within rectangles to be shifted between the exposure passes in a multipass exposure, thus resulting in a smoother edge of the exposed pattern. The invention provides a technique of dynamically defining subfield boundaries between passes of a multipass write, and the basic spot fill of the pattern rectangles can be changed dynamically between passes of a multipass write. This increases the pattern fidelity.

The techniques described can be applied to E-beam mask maker tools other than the EL-4 tool. Thus, while the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A multipass E-beam mask writing system with increased pattern fidelity comprising:

a data storage device storing pattern drive code, the same pattern drive code being used for each pass of a multipass exposure to write a mask;

a shape processor accessing the pattern drive code stored in said data storage device and outputting a rectangle position, rectangle dimensions, subfield boundary, and a rectangle exposure control data to an output buffer;

a shape divider receiving said rectangle position, said rectangle dimensions and said subfield boundary data from said output buffer and moving a boundary location of adjacent subfields between exposure passes resulting in better subfield stitch; and a shape generator receiving said rectangle exposure control data from said output buffer and shifting a boundary location of spots within said rectangles between said exposure passes resulting in a smoother edge of an exposed pattern.

2. The multipass E-beam mask writing system recited in claim 1 wherein said shape divider dynamically defines said subfield boundaries between passes of said multipass write and said shape generator dynamically changes said rectangles between said exposure passes.

3. The multipass E-beam mask writing system recited in claim 2 further comprising a tool controller connected to said shape processor and wherein the subfield boundary data provided to said shape divider is loaded by said tool controller at the beginning of each exposure pass and wherein, based on said subfield boundary data, said tool controller dynamically changes said subfield definition.

4. The multipass E-beam mask writing system recited in claim 3 wherein said shape divider comprises:

comparators receiving said subfield boundary data and comparing the rectangle position data with the subfield boundary data to determine if the rectangle position data falls within said subfield boundaries; and re-referencing means responsive to said comparators for re-referencing the rectangle position if the rectangle position falls outside said outside subfield boundaries.

5. The multipass E-beam writing system recited in claim 4 wherein said shape generator comprises:

spot allocation processing means for receiving said rectangle position and said rectangle dimensions data and calculating a spot position and a spot dimension; and spot exposure processing means for receiving said rectangle exposure control data and calculating an exposure for the spot, said spot exposure processing means being responsive to said comparators for modifying a spot's exposure when that spot's position has crossed into an adjacent subfield to reflect that the spot must be exposed with reduced exposure since said spot will be exposed in two subfields.

6. A method of operating a multipass E-beam mask writing system with increased pattern fidelity comprising the steps of:

storing a pattern drive code, the same pattern drive code being used for each pass of a multipass exposure to write a mask;

accessing the pattern drive code and outputting rectangle position, a rectangle dimensions, a subfield boundary, and a rectangle exposure control data to an output buffer;

receiving said rectangle position, said rectangle dimensions and said subfield boundary data from said output buffer and moving a boundary location of adjacent subfields between exposure passes;

receiving said rectangle exposure control data and shifting a boundary location of spots within said rectangles between said exposure passes.

7. The method of operating a multipass E-beam mask writing system recited in claim 6 further comprising the steps of:

dynamically defining said subfield boundaries between passes of said multipass write; and dynamically changing said rectangles between said exposure passes.

* * * * *